US006978350B2

(12) United States Patent
Birk et al.

(10) Patent No.: US 6,978,350 B2
(45) Date of Patent: Dec. 20, 2005

(54) METHODS AND APPARATUS FOR IMPROVING THROUGHPUT OF CACHE-BASED EMBEDDED PROCESSORS

(75) Inventors: Palle Birk, Gistrup (DK); Joern Soerensen, Aars (DK); Michael S. Allen, Austin, TX (US); Jose Fridman, Swampscott, MA (US)

(73) Assignee: Analog Devices, Inc., Norwood, MA (US)

( * ) Notice: Subject to any disclaimer, the term of this patent is extended or adjusted under 35 U.S.C. 154(b) by 92 days.

(21) Appl. No.: 10/230,528

(22) Filed: Aug. 29, 2002

(65) Prior Publication Data

US 2003/0061445 A1 Mar. 27, 2003

Related U.S. Application Data

(60) Provisional application No. 60/315,655, filed on Aug. 29, 2001.

(51) Int. Cl.[7] .............................................. G06F 12/00
(52) U.S. Cl. ...................... 711/133; 711/159; 711/168; 711/140
(58) Field of Search .................. 711/133, 118, 143, 711/123, 140, 122, 137, 134, 103, 150, 159, 711/168, 169; 712/229, 228

(56) References Cited

U.S. PATENT DOCUMENTS

| | | | |
|---|---|---|---|
| 5,553,276 A * | 9/1996 | Dean ........................... 713/500 |
| 5,867,735 A * | 2/1999 | Zuravleff et al. ............. 710/52 |
| 6,052,777 A * | 4/2000 | Panwar ......................... 712/244 |
| 6,295,580 B1 * | 9/2001 | Sturges et al. ............... 711/129 |
| 6,341,347 B1 * | 1/2002 | Joy et al. ..................... 712/228 |
| 6,430,654 B1 * | 8/2002 | Mehrotra et al. ............ 711/118 |
| 6,578,137 B2 * | 6/2003 | Parady ......................... 712/228 |
| 6,584,546 B2 * | 6/2003 | Kavipurapu .................. 711/120 |
| 6,647,463 B2 * | 11/2003 | Yamashiroya ................ 711/118 |
| 6,684,299 B2 * | 1/2004 | Hetherington et al. ....... 711/140 |
| 6,708,249 B2 * | 3/2004 | Ayukawa et al. ............ 711/104 |
| 6,732,236 B2 * | 5/2004 | Favor ........................... 711/118 |
| 6,751,706 B2 * | 6/2004 | Chauvel et al. .............. 711/122 |
| 2001/0042189 A1 * | 11/2001 | Babaian et al. ............... 712/23 |
| 2002/0060684 A1 * | 5/2002 | Alcorn et al. ................ 345/552 |
| 2002/0087794 A1 * | 7/2002 | Jouppi et al. ................ 711/126 |

FOREIGN PATENT DOCUMENTS

| | | |
|---|---|---|
| EP | 0 735 483 A1 | 10/1996 |
| EP | 0 856 797 A1 | 8/1998 |
| WO | WO 98/19242 A1 | 5/1998 |
| WO | WO 99/21082 A1 | 4/1999 |
| WO | WO 00/68780 A2 | 11/2000 |

* cited by examiner

*Primary Examiner*—Hong Kim
(74) *Attorney, Agent, or Firm*—Wolf, Greenfield & Sacks, P.C.

(57) ABSTRACT

Methods and apparatus are provided for operating an embedded processor system that includes a processor and a cache memory. The method includes filling one or more lines in the cache memory with data associated with a first task, executing the first task, and, in response to a cache miss during execution of the first task, performing a cache line fill operation and, during the cache line fill operation, executing a second task. The cache memory may notify the processor of the line fill operation by generating a processor interrupt or by notifying a task scheduler running on the processor.

24 Claims, 4 Drawing Sheets

METHODS AND APPARATUS FOR IMPROVING THROUGHPUT OF CACHE-BASED EMBEDDED PROCESSORS

CROSS REFERENCE TO RELATED APPLICATION

This application claims the benefit of provisional application Ser. No. 60/315,655, filed Aug. 29, 2001, which is hereby incorporated by reference in its entirety.

FIELD OF THE INVENTION

The present invention relates to digital processing systems and, more particularly, to methods and apparatus for improving processor performance by switching tasks in response to a cache miss.

BACKGROUND OF THE INVENTION

Embedded processors, such as those used in wireless applications, may include a digital signal processor, a microcontroller and memory on a single chip. In wireless applications, processing speed is critical because of the need to maintain synchronization with the timing of the wireless system. Low cost, embedded processor systems face unique performance challenges, one of which is the constraint to use low-cost, slow memory, while maintaining high throughput.

In the example of wireless applications, a digital signal processor (DSP) is often employed for computation intensive tasks. In this system, low-cost, off-chip flash memory forms the bulk storage capacity of the system. However, the flash memory access time is much longer than the minimum cycle time of the digital signal processor. To achieve high performance on the DSP, it should execute from local memory which is much faster than the off-chip flash memory.

Embedded processor systems may implement the local memory with some form of fill-on-demand cache memory control instead of or in addition to simple RAM, which requires another processor or a direct memory access (DMA) controller to load code and/or data into the local memory prior to or after the processor requires the code and/or data.

When the DSP encounters a cache miss, the cache hardware must fill a cache line from the slower memory in the memory hierarchy. This fill-on-demand aspect of the cache often means that the DSP is stalled while all or part of the cache line is filled.

Accordingly, there is a need for methods and apparatus for improving the throughput of cache-based embedded processors.

SUMMARY OF THE INVENTION

According to a first aspect of the invention, a method is provided for operating an embedded processor system that includes a processor and a cache memory. The method comprises filling one or more lines of the cache memory with data associated with a first task, executing the first task, and, in response to a cache miss during execution of the first task, performing a cache line fill operation and, during the cache line fill operation, executing a second task.

According to another aspect of the invention, an embedded processor system comprises a cache memory for storing data associated with a first task, and a processor for executing the first task. The cache memory includes a cache controller for detecting a cache miss, for performing a cache fill operation in response to the cache miss and for generating a cache miss notification. The processor, in response to a cache miss notification during execution of the first task, executes a second task during the cache fill operation.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
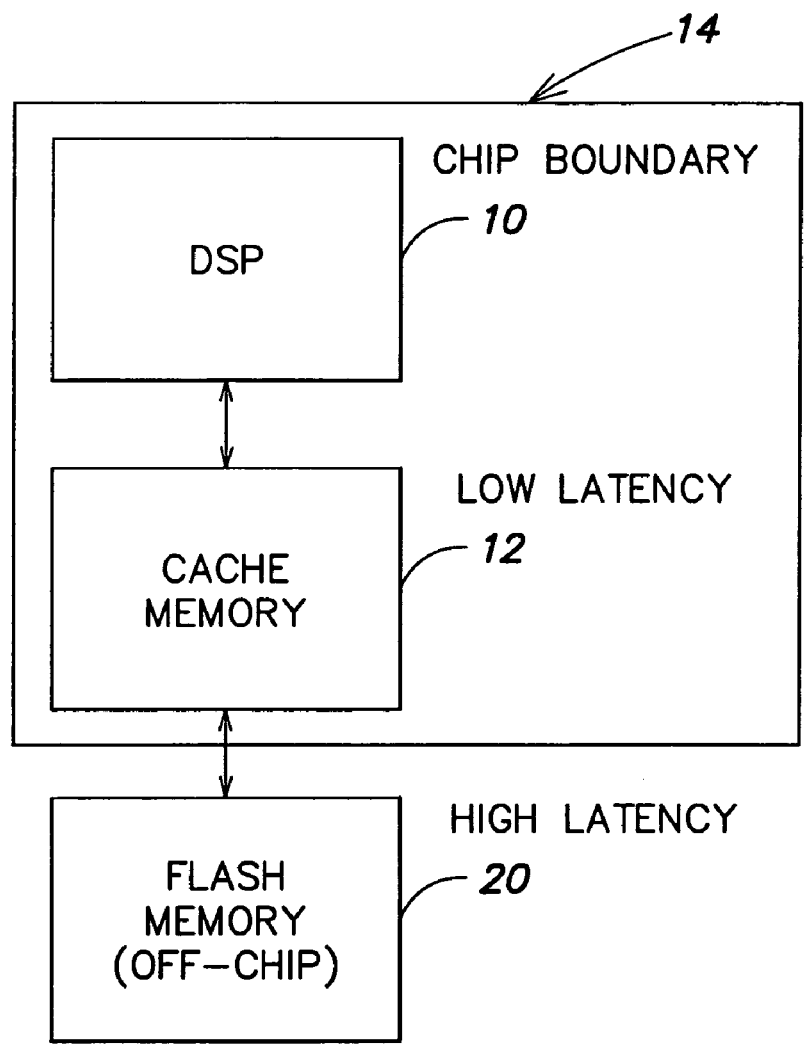
FIG. 1 is a simplified block diagram of a prior art embedded processor system.

A block diagram of a prior art digital processing system is shown in FIG. 1. A processor such as a digital signal processor (DSP) 10 and a cache memory 12 are located on a single processing chip 14. Cache memory 12 may be an instruction cache or a data cache. Some systems may include a data cache and an instruction cache. An off-chip flash memory 20 is coupled to cache memory 12. Processing chip 14 may include other components, such as an on-chip memory, a microcontroller for executing microcontroller instructions, a direct memory access (DMA) controller and various interfaces to off-chip devices.

The cache memory 12 and the flash memory 20 form a memory hierarchy in which cache memory 12 has relatively low latency and relatively low capacity, and flash memory 20 has relatively high latency and relatively high capacity. In operation, DSP 10 executes instructions and accesses data and/or instructions in cache memory 12. The low latency cache memory 12 provides high performance except when a cache miss occurs. In the case of a cache miss, a cache line fill operation is required to load the requested data from flash memory 20. The time required to load a cache line from flash memory 20 may be several hundred clock cycles of DSP 10. During the line fill operation, the DSP 10 is stalled, thereby degrading performance.

Figure 2:
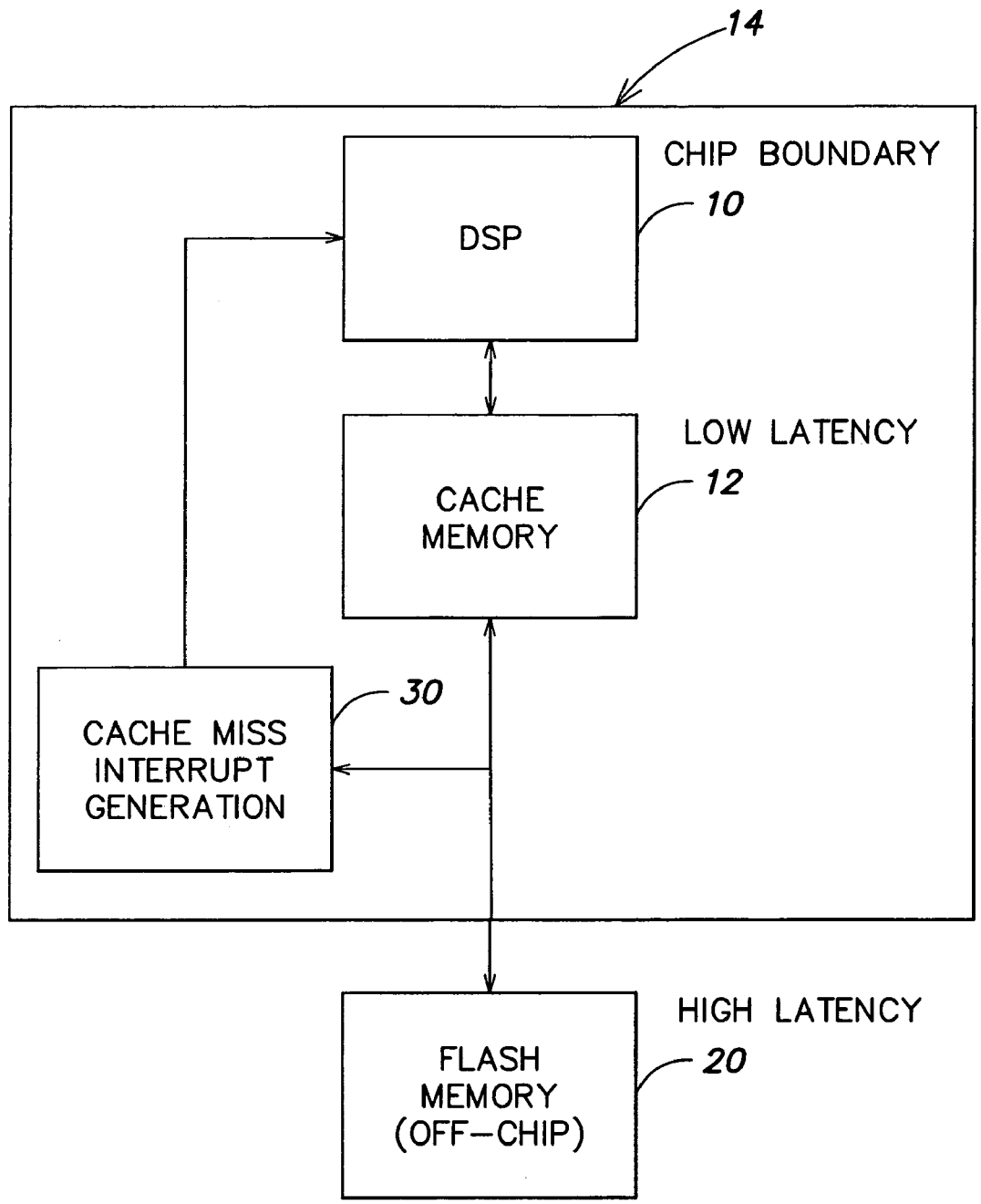
FIG. 2 is a simplified block diagram of an embedded processor system in accordance with an embodiment of the invention.

A simplified block diagram of a digital processing system in accordance with an embodiment of the invention is shown in FIG. 2. Like elements in FIGS. 1 and 2 have the same reference numerals. An example of a suitable DSP is disclosed in PCT Publication No. WO 00/687 783, published Nov. 16, 2000. However, the invention is not limited to any particular digital signal processor. Further, the DSP 10 may be replaced by a microcontroller, a general purpose microcomputer or any other processor.

According to a feature of the invention, instead of stalling the DSP 10 for the duration of the cache line fill operation, the DSP 10 is redirected to execute an alternative software task, such as an interrupt service routine (ISR). Processing of the first software task can resume at a later time, when the cache line fill operation has completed. Referring to FIG. 2, a cache miss interrupt generator 30 detects a cache line fill operation, wherein cache memory 12 performs a cache line fill operation from flash memory 20, and generates an interrupt to DSP 10. In response, DSP 10 executes a second software task during the cache line fill operation. The disclosed method enhances performance by utilizing processor time in which the processor would otherwise be stalled waiting for completion of the cache line fill operation.

A software organization wherein the software is organized as multiple independent threads, which are managed by an operating system (OS) scheduler, can also take advantage of this approach. In this case, a new software thread may be started during the cache line fill operation. The multithreaded software organization can be viewed as a more general superset of the main routine/interrupt service routine model. The main/ISR model effectively includes two software threads, and the processor interrupt hardware functions as the task scheduler.

The elements of a system employing this approach are: (1) a processor with a much faster cycle time than the memory subsystems it accesses; (2) a processor sequencer organization which, upon recognizing an interrupt assertion of higher priority than the current task, aborts the instructions which have already entered the instruction pipeline and redirects instructions fetched to the new task. This functionality allows a load operation to start and to generate a memory access, but then be aborted, allowing another task to start; (3) code and/or data caches between the processor and the slower memory subsystems; and (4) software modularity such that independent tasks (e.g., interrupt processing or multiple threads) are available to run on the processor at any time.

The system may optionally include circuitry to signal the operating system that a cache miss has occurred, allowing the operating system to start the next pending software task/thread. Without this circuit, the processor stalls on a cache miss in the conventional way, unless an unrelated interrupt occurs while the processor is stalled. With the additional circuitry, the system can guarantee that the interrupt will always be taken on a cache miss. Another option is to include address range checking circuitry, such that the interrupt on a cache miss is generated only if the memory address associated with the cache miss is within a specified address range. The address range may be fixed or programmable. As an optional enhancement in embedded systems with multiple memory subsystems, with different access latencies (e.g., off-chip flash memory and on-chip SRAM memory), the cache can employ multiple line fill and copyback buffers to further enhance overall throughput. This enhancement also requires either separate buses between the cache controller and each of the memory systems, or a common bus employing out-of-order line fill protocols (e.g., bus data tagging).

Referring again to FIG. 2, when the DSP 10 generates a memory access which misses the cache memory 12, but is cacheable, the cache controller generates a cache line fill operation to the off-chip flash memory 20. The access time to fetch the entire cache line from flash memory can be hundreds of processor cycles.

The cache miss interrupt generator 30 determines that a cache line fill operation has been requested by the cache controller and generates an interrupt to DSP 10. Since the DSP 10 aborts the instructions in the pipeline upon detection of an interrupt, it aborts the instruction which generated the cache line miss and begins execution of the interrupt service routine.

The interrupt service routine determines the next appropriate step. For example, the ISR may determine that a high priority task, which is resident in the local memory system, is available to run. As long as the ISR hits in the local cache (or, as is often the case, the ISR executes out of local RAM, which is accessed in parallel with the local cache), then the DSP 10 is not stalled for the lengthy time required to complete the cache line fill operation. When the ISR has run to completion, execution returns to the lower priority task which generated the cache miss.

In the more general multithreaded software model, the interrupt invokes the operating system scheduler, which then passes execution to the current highest priority software thread which can run in the available local memory resources. That software thread either (a) runs to completion, or (b) is preempted by the scheduler at some point, such that another thread can run, such as the thread that was preempted on the cache miss, assuming that the cache line fill operation has now been completed.

Figure 3:
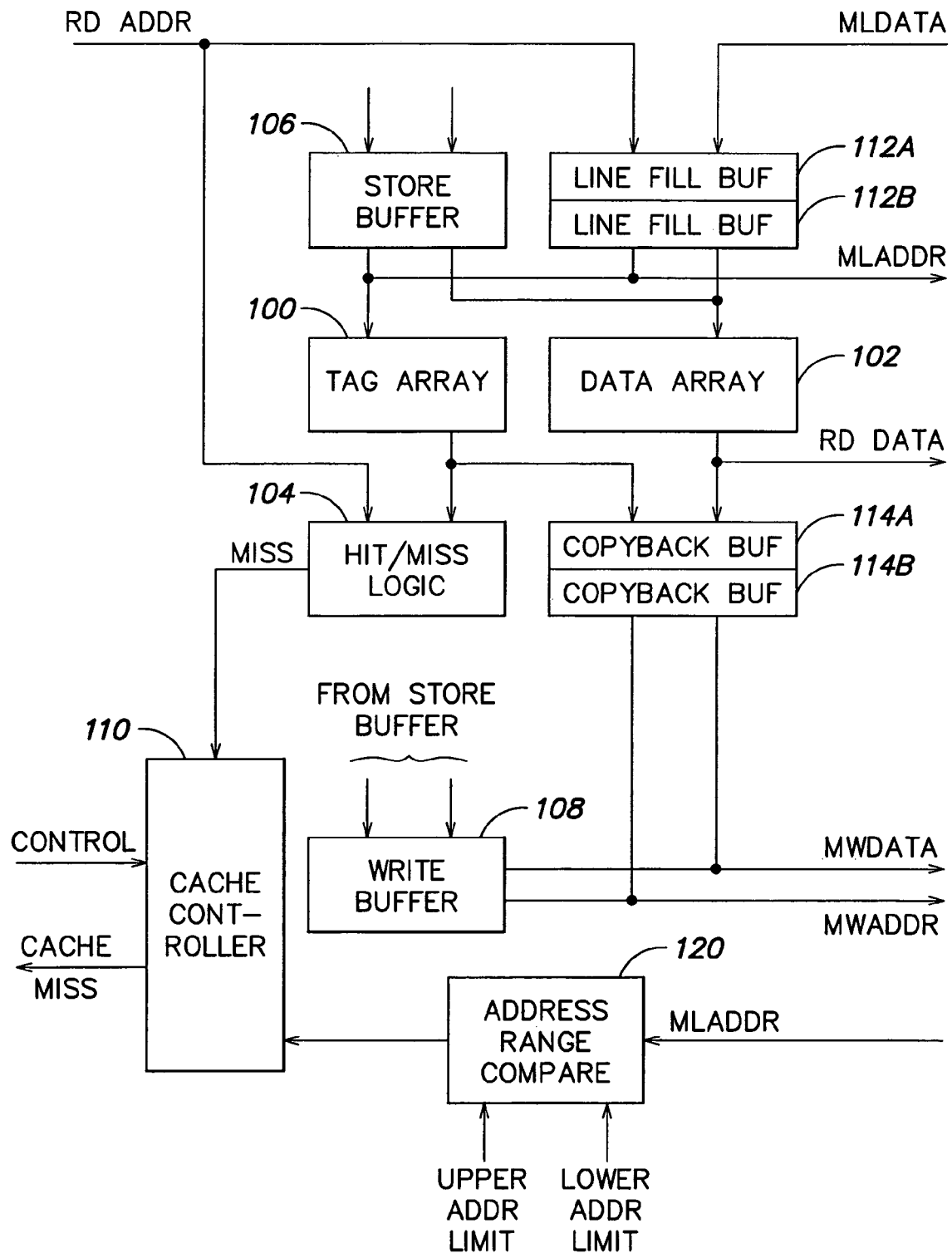
FIG. 3 is a block diagram of an embodiment of the cache memory shown in FIG. 2.

A block diagram of an embodiment of cache memory for implementing the present invention is shown in FIG. 3. The cache memory of FIG. 3 corresponds to the cache memory 12 and the cache miss interrupt generator 30 of FIG. 2. As is conventional, the cache memory includes a tag array 100, a data array 102, hit/miss logic 104, a store buffer 106 and a write buffer 108. The cache memory further includes a cache controller 110 having circuitry for generating a cache miss signal, one or more line fill buffers 112A and 112B and one or more copyback buffers 114A and 114B. The cache memory may further include an address range compare circuit 120.

When a read access is generated by DSP 10 during execution of a first task or thread, the read address is supplied to hit/miss logic 104. The tag array 100 stores upper address bits to identify the specific address source in memory that the cached line represents. The tags are compared with the read address to determine whether the requested data is in the cache. In the case of a hit, the read data is supplied to the DSP 10. In the case of a miss, a miss signal is supplied to cache controller 110 and a cache line fill operation is initiated. In the cache line fill operation, a cache line containing the requested data is read from flash memory 20. The cache line is loaded into tag array 100 and data array 102 through line fill buffer 112 and is available for use by DSP 10.

In the case of a cache miss, cache controller 110 supplies a cache miss signal to DSP 10 to initiate execution of a second task or thread by DSP 10. In the case of a cache miss, the cache line that is replaced may be copied to flash memory 20 through copyback buffer 114A, 114B. Optionally, the cache memory may include two or more line fill buffers 112A, 112B and two or more copyback buffers 114A, 114B for enhanced performance in executing a second software task during the cache line fill operation.

Address range compare circuit 120 may optionally be provided to limit the address range over which a second task is executed during the cache line fill operation. In particular, the address range compare circuit 120 receives an upper address limit and a lower address limit, which may be fixed or programmable. Address range compare circuit 120 also receives the memory load address supplied to flash memory 20 in the case of a cache line fill operation. The address range compare circuit 120 may be configured to determine if the memory load address is between the upper address limit and the lower address limit, either inclusively or exclusively. In another approach, address range compare circuit 120 may determine if the memory load address is outside the range between the upper address limit and the lower address limit. In any case, if a specified comparison criteria is satisfied, a signal is supplied to cache controller 110 to enable the cache miss signal to be supplied to DSP 10.

Figure 4:
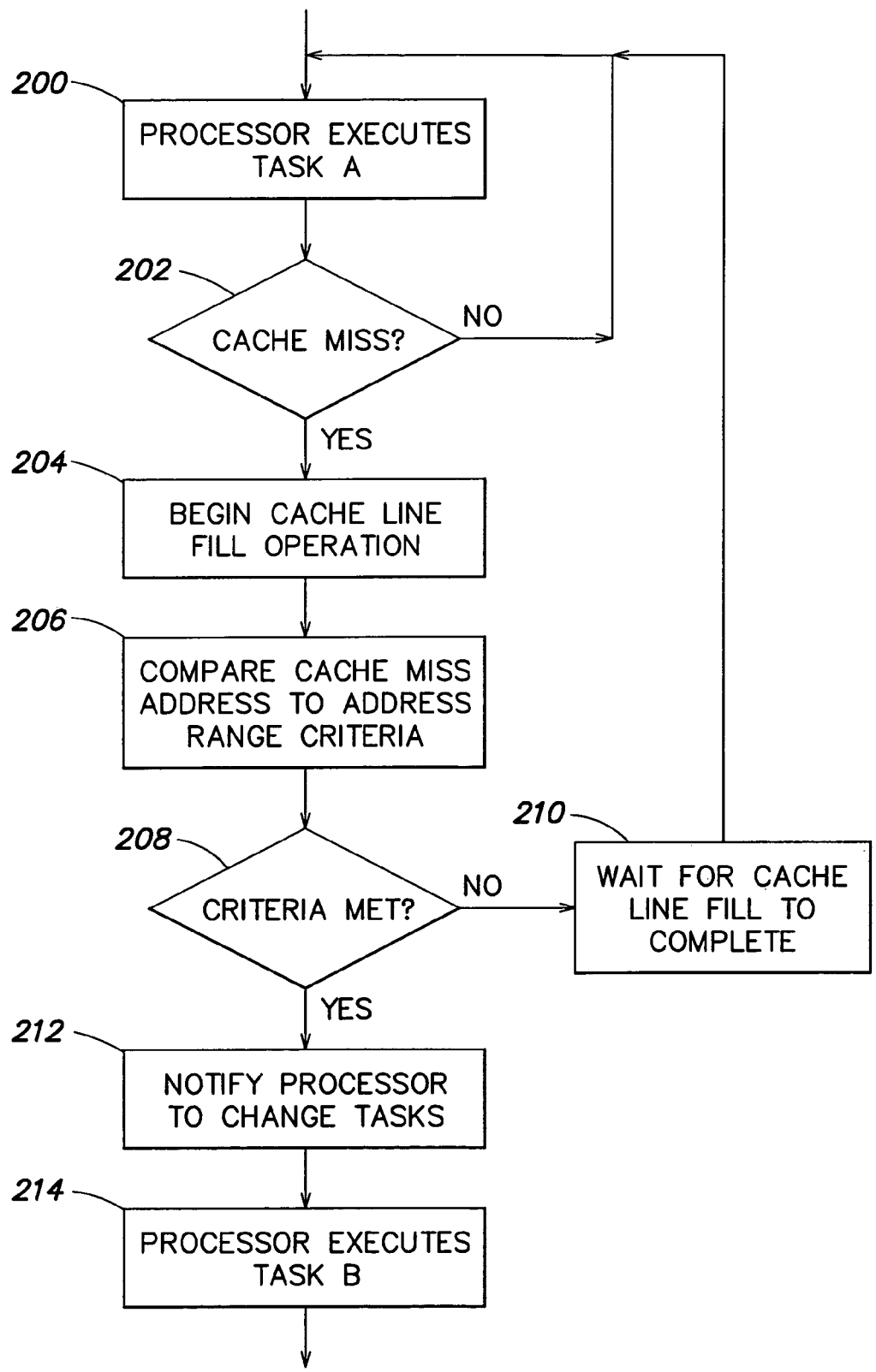
FIG. 4 is a flow diagram of a routine implemented by the cache controller in accordance with an embodiment of the invention.

A flow chart of a routine for improving processor performance by switching tasks in response to a cache miss operation is shown in FIG. 4. In step 200, the processor (DSP 10) executes task A by referencing operands and/or instructions in cache memory 12. In step 202, cache memory 12 determines if a cache miss has occurred. If a cache miss has not occurred, the processor continues to execute task A in step 200. In the case of a cache miss, cache memory 12 begins a cache line fill operation in step 204. The cache line fill operation loads a cache line containing the requested data from the flash memory 20 into cache memory 12. In step 206, the address range compare circuit 120 in cache memory 12 compares the cache miss address to a selected address range as described above. In step 208, a determination is made as to whether the cache miss address meets a specified address range comparison criteria. If the cache miss address does not meet the address range comparison criteria, the processor waits for the cache line fill operation to complete in step 210 and returns to execution of task A in step 200. If the cache miss address meets the address range comparison criteria, the processor is notified to change tasks in step 212. With reference to FIG. 3, cache controller 110 sends a cache miss signal to DSP 10. The processor then executes task B in step 214 during the cache line fill operation. It will be understood that steps 206, 208 and 210 associated with address range comparison are optional in the process of FIG. 4.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method for operating an embedded processor system that includes a processor and a cache memory, comprising:
   filling one or more lines of the cache memory with data associated with a first task;
   executing the first task including accessing data in the cache memory;
   in response to a cache miss during execution of the first task, performing a cache line fill operation;
   comparing an address associated with the cache line fill operation to a specified address range;
   notifying the processor of the cache line fill, including supplying a cache miss signal to the processor, only if a result of the address range comparison meets a predetermined criteria; and
   in response to the cache miss signal, executing a second task during the cache line fill operation.

2. A method as defined in claim 1, wherein the data comprises one or more operands associated with the first task.

3. A method as defined in claim 1, wherein the data comprises one or more instructions associated with the first task.

4. A method as defined in claim 1, wherein the step of notifying the processor of the cache line fill operation further comprises notifying a task scheduler running on the processor.

5. A method as defined in claim 1, wherein the step of executing a second task comprises executing a task of higher priority than the first task.

6. A method as defined in claim 1, wherein the first and second tasks are executed on a single processor.

7. A method as defined in claim 1, wherein the first and second task are executed on first and second processors, respectively.

8. A method as defined in claim 1, wherein the address range used in the address range comparison is programmable.

9. A method as defined in claim 1, further comprising accessing data associated with the second task in the cache memory.

10. A method as defined in claim 1, wherein the step of executing the second task comprises fetching instructions and operands for the second task.

11. A method as defined in claim 1, further comprising resuming the first task when the cache line fill operation has completed.

12. An embedded processor system comprising:
    a cache memory for storing data associated with a first task, said cache memory including a cache controller for detecting a cache miss, for performing a cache line fill operation in response to the cache miss, for comparing an address associated with the cache line fill operation to a specified address range and for generating a cache miss notification, including supplying a cache miss signal, only if a result of the address range comparison meets a predetermined criteria; and
    a processor for executing the first task and, in response to the cache miss signal during execution of the first task, executing a second task during the cache line fill operation.

13. An embedded processor system as defined in claim 12, wherein the data comprises one or more operands associated with the first task.

14. An embedded processor system as defined in claim 12, wherein the data comprises one or more instructions associated with the first task.

15. An embedded processor system as defined in claim 12, wherein the cache miss notification further comprises a notification to a task scheduler running on said processor.

16. An embedded processor system as defined in claim 12, wherein the second task has higher priority than the first task.

17. An embedded processor system as defined in claim 12, wherein the first and second tasks are executed on a single processor.

18. An embedded processor system as defined in claim 12, wherein said processor comprises first and second processors and wherein said first and second tasks are executed on said first and second processors, respectively.

19. An embedded processor system as defined in claim 12, wherein the specified address range is programmable.

20. An embedded processor system as defined in claim 12, wherein said cache memory is configured for storing data associated with the second task.

21. An embedded processor system as defined in claim 12, wherein said processor includes means for fetching instructions and operands for executing the second task.

22. An embedded processor system as defined in claim 12, wherein said processor further includes means for resuming execution of the first task when the cache line fill operation has completed.

23. An embedded processor system as defined in claim 12, wherein said cache memory includes two or more line fill buffers.

24. An embedded processor system as defined in claim 12, wherein said cache memory includes two or more copyback buffers.

* * * * *